US005502887A

United States Patent [19]
Gonzales

[11] Patent Number: 5,502,887
[45] Date of Patent: Apr. 2, 1996

[54] CHIP EXTRACTION TOOL

[75] Inventor: Guadalupe V. Gonzales, Elgin, Tex.

[73] Assignee: Dell USA, L.P., Austin, Tex.

[21] Appl. No.: 88,972

[22] Filed: Jul. 8, 1993

[51] Int. Cl.⁶ ................................................ H05K 13/04
[52] U.S. Cl. ................................................ 29/764; 29/758
[58] Field of Search ............................ 29/253, 278, 741, 29/758, 764, 258, 740

[56]  References Cited

U.S. PATENT DOCUMENTS

| | | |
|---|---|---|
| 3,443,297 | 5/1969 | Lusby, Jr. ................................. 29/764 |
| 3,699,629 | 10/1972 | Hood, Jr. et al. ......................... 29/764 |
| 3,797,092 | 3/1974 | Einarson ................................... 29/741 |
| 4,215,468 | 8/1980 | Greco ................................... 29/278 X |
| 4,583,287 | 4/1986 | McDevitt et al. ..................... 29/758 X |
| 4,660,281 | 4/1987 | Omand . |
| 4,679,319 | 7/1987 | Grabbe et al. . |
| 4,700,132 | 10/1987 | Yarbrough et al. . |
| 4,723,361 | 2/1988 | Carlson et al. . |
| 4,744,140 | 5/1988 | Bright . |
| 4,747,209 | 5/1988 | Schaeffer et al. . |
| 4,866,838 | 9/1989 | Porter . |
| 4,868,986 | 9/1989 | Olson et al. . |
| 4,873,761 | 10/1989 | Korsunsky et al. . |
| 4,879,806 | 11/1989 | Feng . |
| 4,979,287 | 12/1990 | Schwab et al. . |
| 4,984,355 | 1/1991 | Lubrano et al. . |
| 5,144,747 | 9/1992 | Eichelberger . |
| 5,152,052 | 10/1992 | Rantala et al. . |
| 5,174,016 | 12/1992 | Todd . |
| 5,193,269 | 3/1993 | Dattilo ................................. 29/741 X |
| 5,208,731 | 5/1993 | Blomquist . |

FOREIGN PATENT DOCUMENTS

| | | | |
|---|---|---|---|
| 2745966 | 4/1979 | Germany ................................. 29/764 |
| 2813481 | 7/1979 | Germany ................................. 29/764 |
| 2055322 | 3/1981 | United Kingdom .................... 29/764 |

Primary Examiner—Peter Vo
Attorney, Agent, or Firm—Henry Garrana; Michelle Turner

[57] ABSTRACT

Apparatus and method is disclosed for removing an integrated circuit chip from a socket in a printed circuit board without damaging the chip or other components on the circuit board. The tool has a pair of arms slidably attached to a base. The lower ends of each arm have wedge-shaped teeth projecting inwardly toward the base. Components are provided within a cavity in the base for evenly and simultaneously moving the arms and teeth inwardly toward the base. The wedge-shaped teeth are thereby driven between the socket and chip so that the chip is forced away from the socket by the inclined upper surfaces of the teeth until the chip is disengaged from the socket. The even action of the teeth disengages the chip from the socket without bending pins of the chip or otherwise damaging the chip. Further, the tool does not rest upon or press against the circuit board as the chip is removed from the socket, so the tool removes the chip from the socket without damaging other components on the circuit board.

16 Claims, 4 Drawing Sheets

CHIP EXTRACTION TOOL

TECHNICAL FIELD

The invention relates generally to a tool for removing integrated circuit chips from sockets in printed circuit boards and more specifically to apparatus and method for such removal without damaging the integrated circuit chips, the sockets or other components on the circuit boards.

BACKGROUND OF THE INVENTION

In personal computers, it is customary to have a variety of integrated circuit chips removably attached to sockets disposed in the printed circuit board. The chips have varying numbers of pins extending from lower surfaces of the chips which are inserted into corresponding sockets to electrically connect the chips to the circuitry of the underlying circuit board.

It is occasionally necessary to remove chips from their sockets. The chips are fragile, and the pins extending from the chips are easily bent and damaged. The circuit board is also typically crowded with other components which are easily damaged. Accordingly, extreme care must be exercised when removing chips from their sockets.

Conventional tools used to remove chips from sockets have proven inadequate. One tool commonly used for removing chips from their sockets, known as a "spatula," is used much like a pry bar to pry alternating sides of a chip slightly further away from the socket until the pins of the chip are disengaged from the socket. The rocking motion created by this tool and technique has a tendency to bend the chip's pins or otherwise damage the chip.

Other types of tools typically used to remove chips from sockets include a number of plier-like devices which are used to grip and lift a chip from its socket. These plier-like devices have a tendency to apply uneven stress to the chip body or to otherwise impart unnecessary transverse or horizontal forces to the pins. Further, these plier-like devices often must rest upon or press against the circuit board while being used to extract a chip. This is undesirable because it creates an unnecessary risk damage to other components or devices on the crowded circuit board or requires that a clear space be provided on the circuit board around the socket. This is also undesirable because the circuit board is typically crowded with components, making board space precious.

What is needed is a chip extraction device which can quickly and easily remove a chip from a socket without damaging the chip, the socket or other components on the circuit board.

SUMMARY OF THE INVENTION

The foregoing problems are solved and a technical advance is achieved by apparatus and method for quickly and easily removing a chip from a socket without damaging the chip or components on the circuit board. In a departure from the art, wedge-shaped teeth are aligned on opposite sides of the chip and are driven simultaneously between the chip and the socket to lift the chip evenly from the socket without applying uneven stress to the chip body and without bending the pins or otherwise imparting unnecessary transverse or horizontal forces to the pins. The tool does not contact the circuit board during operation, so components may be located in the precious circuit board space near the socket without a significant risk of damage due to chip removal tools and techniques.

In an illustrative embodiment, the apparatus comprises a base, two opposing arms slidably mounted on the base and having wedge-shaped teeth, and components for simultaneously and evenly moving the arms and teeth inwardly toward the base. The wedge-shaped teeth are thereby driven between the socket and chip so that the chip is forced away from the socket by the inclined upper surfaces of the teeth until the chip is disengaged from the socket. For simultaneously and evenly moving the arms and teeth inwardly toward the base, pistons are secured to the arms. The base has a cavity, and the pistons slidably pass through holes in side walls of the base into the cavity. A yoke is slidably nested within the cavity and has sloping legs which contact rods or engaging members that are secured to pistons within the cavity. The legs simultaneously and evenly move the engaging members and pistons inwardly as the yoke is urged downwardly within the cavity, thereby simultaneously and evenly drawing the arms and teeth inwardly toward the base. Non-linear movement of the arms is limited so that force is evenly applied to opposing sides of the chip and socket by the teeth extending along the lower edges of the arms.

The base has a skirt portion which is sized to nest closely over a chip to be removed from a socket. The size and shape of the skirt and the alignment of the teeth are carefully predetermined so that when the chip is nested within a lower cavity in the skirt, the teeth will be simultaneously aligned horizontally to pass between pins extending downwardly from the lower surface of the chip. Retractable planar supports are also provided in the lower cavity for supporting the tool from the upper surface of a chip and for biasing the chip against the teeth as the chip is removed from the socket.

A technical advantage achieved with the invention is that in removing a chip from a socket, the chip is maintained level as it is raised substantially vertically from the socket, thereby maintaining the pins of the chip substantially perpendicular to the socket and avoiding unnecessary transverse or horizontal forces on the pins as the chip is removed from the socket.

Another technical advantage is that the tool permits pressure to be applied simultaneously and evenly across opposing sides of a chip and socket thereby reducing the risk of damaging the sides of the chip or socket and the risk of bending the pins of the chip.

Another technical advantage achieved is that the tool need not rest upon or press against the circuit board, thereby reducing the risk of damage to the circuit board and components on the circuit board. This also permits more of the precious board space to be utilized.

DESCRIPTION OF THE PREFERRED EMBODIMENT

Figure 1:
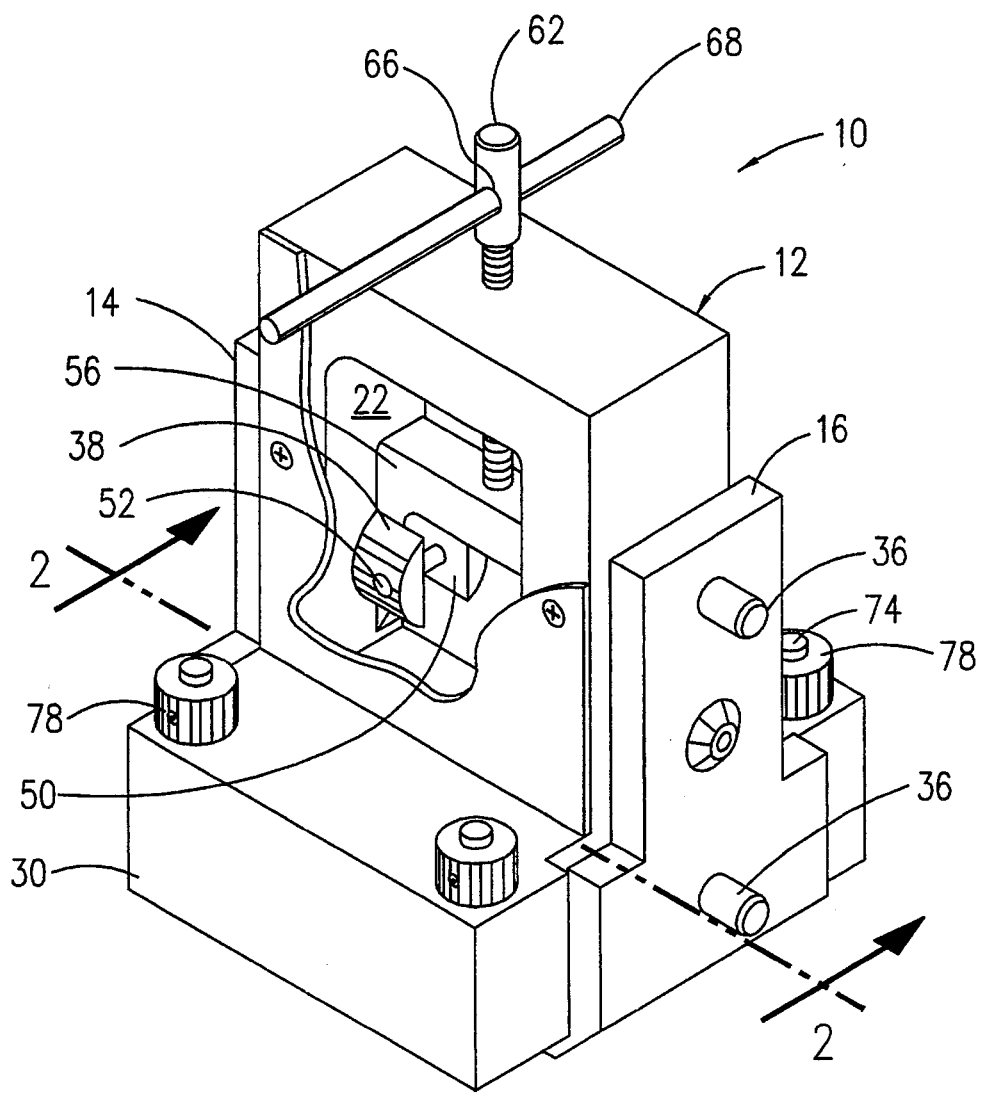
FIG. 1 is an elevated, partially exploded view of an apparatus of the present invention.

In FIG. 1, the reference numeral 10 designates a chip extraction tool embodying the features of the present invention. The tool 10 comprises a base 12, two arms 14, 16 having teeth 18, 20, and components for simultaneously moving the arms 14, 16 and teeth 18, 20 inwardly toward the base 12.

Figure 2:
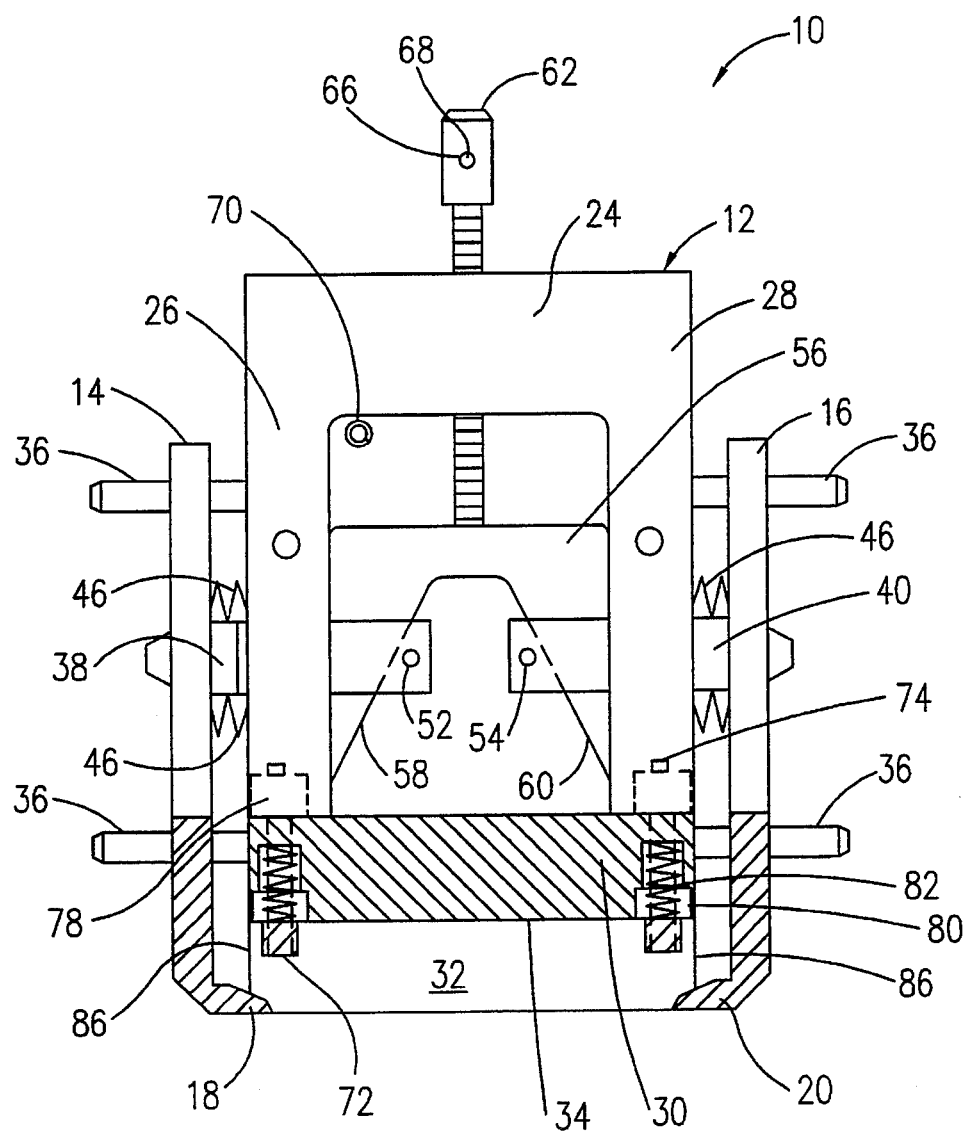
FIG. 2 is a cross-sectional view taken along line 2—2 of FIG. 1.
Figure 3:
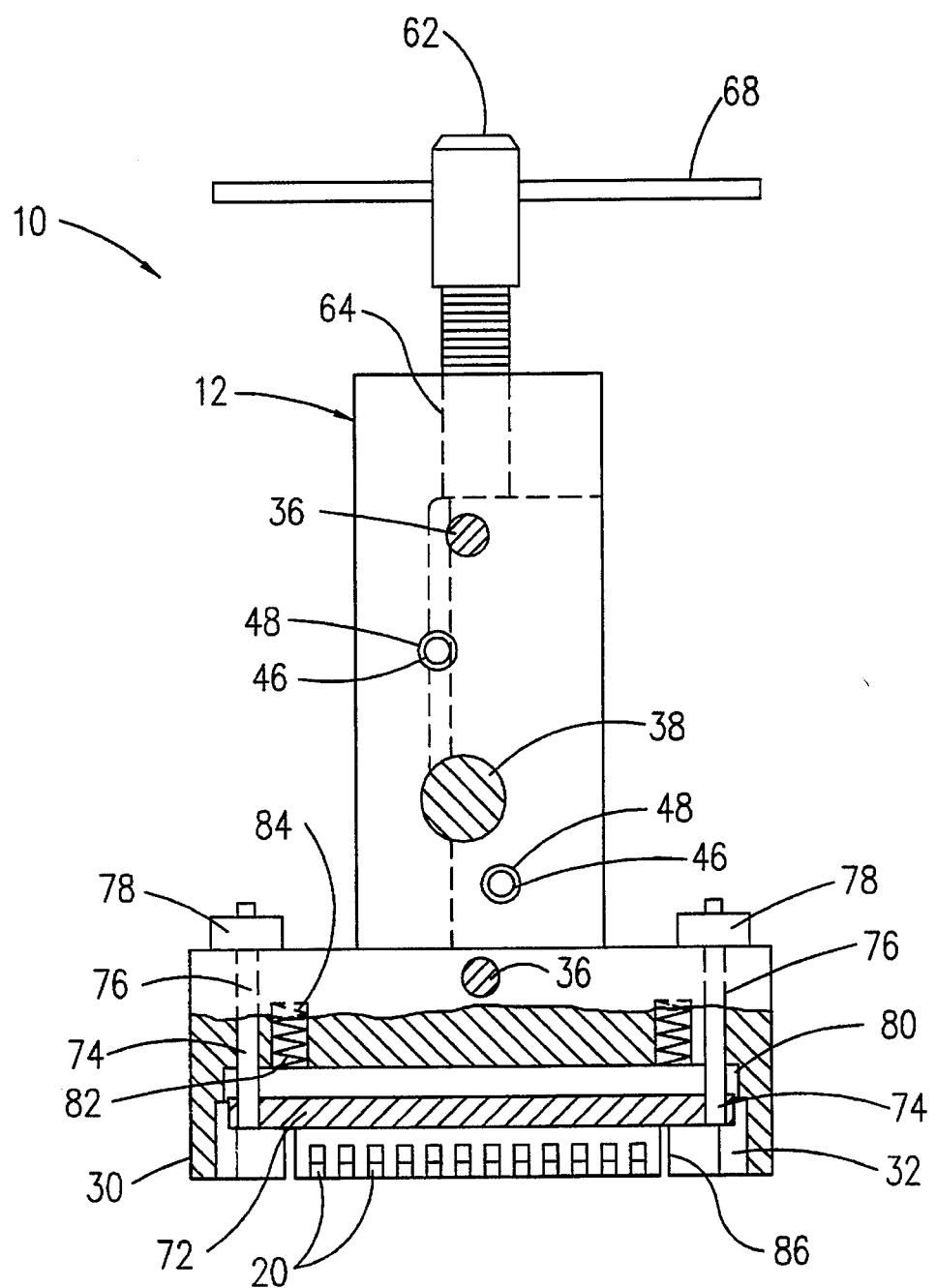
FIG. 3 is a partially exploded, side view of an apparatus of the present invention.
Figure 4:
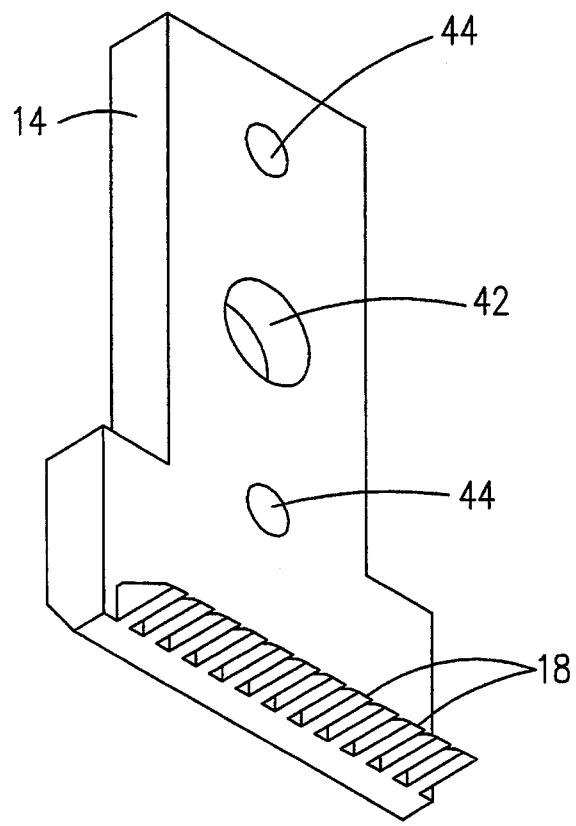
FIG. 4 is an elevated, isolation view of an arm and teeth of the tool depicted in FIGS. 1–3.

As shown in FIGS. 1–3, the base 12 has an upper cavity 22 bounded in part by a top wall 24 and two side walls 26, 28. The base 12 also has a skirt portion 30 which forms a second, lower cavity 32 having a roof 34. For reasons to be described, guides 36 are rigidly secured in openings formed in the side walls 26, 28.

The arms 14, 16 are rigidly secured to pistons 38, 40 which slidably extend through holes 42 formed through the side walls 26, 28. Holes 44 pass through the arms 14, 16 and are sized and aligned to slidably engage the guides 36. Although four guides 36 are depicted as being affixed to the base 12 and sliding through holes 44 in the arms 14, 16, it is understood that fewer or more guides 36 may be used. Also, the guides 36 may be affixed to the arms 14, 16, and holes may be formed in the base 12 for slidably receiving the guides 36 within the base 12. Springs 46 are nested in holes 48 in the base and are disposed between the arms 14, 16 and the base 12 to bias the arms 14, 16 away from the base 12 when the springs 46 are compressed.

As shown in FIGS. 1 and 2, within the cavity 22, the pistons 38, 40 have channels 50 formed through inner ends of the pistons 38, 40, and engaging members 52, 54 are secured to the pistons 38, 40, respectively, to extend across the channels 50 near the inner ends of the pistons 38, 40. A yoke 56 is slidably nested within the cavity 22. The yoke 56 has legs 58, 60 which extend between the engaging members 52, 54 and inner surfaces of the side walls 26, 28. The legs 58, 60 thereby retain the inner ends of the pistons 38, 40 within the cavity 22 thereby keeping the arms 14, 16 slidably mounted to the base 12. The yoke 56 is nested within the cavity 22 so that it may slide between upper and lower limits.

A handle 62 passes in threaded engagement through a hole 64 in the top wall 24 and into the cavity 22. A hole 66 passes through an upper portion of the handle 62 and a rod 68 is slidably disposed through the hole 66 to facilitate easy rotation of the threaded handle 62. Although not shown in the drawings, the ends of the rod 68 are enlarged or provided with collars or other means to keep the rod 68 from being removed from the hole 66. Although not clear from the drawings, the handle 62 has a hardened, pointed, unthreaded lower tip which mates with a hardened, unthreaded hole in an upper surface of the yoke 56. The springs 46 bias the arms 14, 16 away from the base 12 and therefore bias the engaging members 52, 54 against the legs 58, 60 of the yoke 56. In turn, this tends to bias the yoke 56 upwardly against the handle 62 so that the yoke 56 slides upwardly within the cavity 22 as the handle 62 is retracted in the cavity 22.

The handle 62 may be twisted clockwise to advance the handle 62 further into the cavity 22, forcing the yoke 56 to move downwardly in the cavity 22. As this happens, the angled legs 58, 60 of the yoke 56 force the engaging members 52, 54 inwardly toward one another, thereby moving the arms 14, 16 and teeth 18, 20 inwardly towards the base 12. Conversely, the handle 62 may be twisted counterclockwise to retract the handle 62 from the cavity 22. As this happens, the yoke 56 is urged upwardly by the engaging members 52, 54 which are biased outwardly by the springs 46. The yoke 56 will continue to move upwardly as the handle 62 is retracted until the yoke 56 contacts a pin 70 (FIG. 2) which sets an upper limit for the yoke 56 to prevent the lower portions of the legs 58, 60 from rising completely above the engaging members 52, 54. It is understood that means other than a threaded handle 62 may be used to control movement of the yoke 56 within the cavity 22. It is also understood that the yoke 56 may be disposed substantially below the pistons 38, 40 and appropriate means provided for moving the yoke 56 upwardly and downwardly within the cavity 22.

For reasons to be described, it is important that the teeth 18, 20 move evenly with substantially equal and opposite velocities as the handle 62 is advanced into the cavity 22. In that regard, an imaginary plane extending between and parallel to the planes of the arms 14, 16 and dividing the tool 10 through the middle of the base 12, divides the tool into right and left halves which are substantially mirror images. For example, the lower surfaces of the legs 58, 60 of the yoke 56 which contact the engaging members 52, 54 form substantially identical, constant angles with the inner walls of the cavity 22. Further, at all positions of the yoke 56 within the cavity 22, the engaging members 52, 54 extend substantially equal distances into the cavity 22. Further still, at all positions of the yoke 56 within the cavity 22, the teeth 18, 20 extend substantially equal distances into the lower cavity 32.

Although such symmetry is preferred, it is understood that as long as the tool 10 provides for substantially equal and opposite movement of the teeth 18, 20, the symmetry of the tool 10 may be adjusted. For example, the legs 58, 60 of the yoke 56 may take any number of shapes and may include portions having parabolic, semicircular, or other curved shapes or combinations thereof.

As shown in FIGS. 2 and 3, the lower cavity 32 formed by the skirt 30 of the base 12 houses planar supports 72 which are retractably supported therein. Rods 74 are rigidly secured to the supports and pass through holes 76 provided in the roof 34 of the lower cavity 32. Collars 78 are secured to upper ends of the rods 74, and the rods 74 are free to slide within the holes 76. Recesses 80 are provided in the roof 34 of the lower cavity 32 for receiving the supports 72 as the supports 72 are forced upwardly within the lower cavity 32. Springs 82 are disposed in holes 84 in the recesses 80 and extend between the holes 84 and upper surfaces of the supports 72 to bias the supports 72 downwardly away from the holes 84 and recesses 80, while the collars 78 establish lower limits to which the supports 72 may extend. Although two planar supports 72 are depicted, it is understood that one or any number of supports 72 may be used as desired.

The skirt 30 is sized to nest closely over a desired chip. Spaces 86 are provided along opposing sides of the skirt 30 to allow the teeth 18, 20 of the arms 14, 16 to move into the lower cavity 32 under the base 12. In the open position, the teeth 18, 20 are disposed outside of the lower cavity 32. As the arms 14, 16 and teeth 18, 20 are moved inwardly from the open position, the teeth 18, 20 pass through the spaces 86 and extend into the lower cavity 32.

Figure 5:
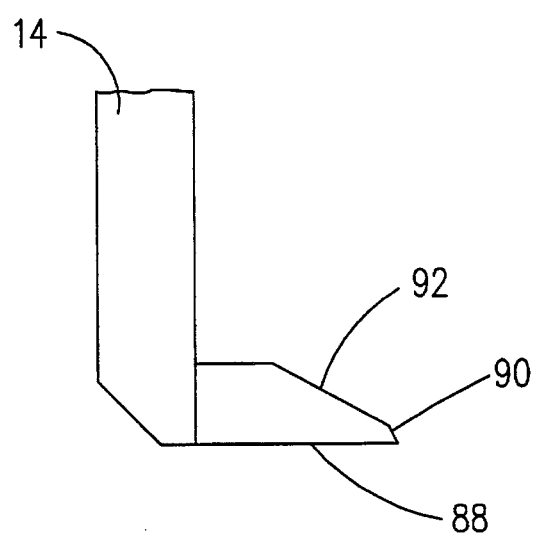
FIG. 5 is an enlarged, partial view of the arm and teeth of FIG. 4.

As shown in FIG. 5, the wedge-shaped teeth 18, 20 have flat, horizontal lower surfaces 88. A first portion 90 of the upper surface angles upwardly at an angle of approximately 45°, and a second portion 90 of the upper surface extends upwardly at an angle of approximately 23° over a substantial portion of the upper surface. Angles significantly steeper than approximately 23° may tend to damage the sides of the chip as the chip is being removed. Conversely, the use of angles significantly less than approximately 23° would require the teeth 18, 20 to be undesirably long and would require an undesirably wide range of motion for the arms 14, 16 and teeth 18, 20. It is understood that other shapes may be used. For example, the more steeply angled first portion 90 need not be used. Similarly, the orientation of the teeth 18, 20 may be inverted so that the upper surface rather than the lower surface is substantially horizontal, or neither the upper nor lower surface may be disposed substantially horizontally. Also, the upper and lower surfaces need not be planar but may include curved portions. The teeth 18, 20 are preferably shaped to incrementally increase separation of the chip from the socket as the teeth 18, 20 are driven further between the chip and the socket.

In operation, the handle 62 is twisted counterclockwise to retract the handle 62 from within the cavity 22 until the tool 10 is placed in an open position in which the teeth 18, 20 do not extend into the lower cavity 32. In this regard, as the lower end of the handle 62 is raised within the cavity 22, springs 46 cause the engaging members 52, 54 to bias against the legs 58, 60 and to urge the yoke 56 upwardly within the cavity 22 so that the yoke 56 is raised within the cavity 22 along with the lower end of the handle 62. The springs 46 bias the engaging members 52, 54 against the sloping lower surfaces of the legs 58, 60. As the legs 58, 60 move upwardly within the cavity 22, the engaging members 52, 54 are moved closer to the holes 42 in the side walls 26, 28, permitting the pistons, 38, 40 to slide outwardly from the cavity 22. This permits the springs 46 to move the arms 14, 16 away from the base 12, thereby moving the teeth 18, 20 outwardly from the lower cavity 32.

After the tool 10 is placed in the open position, the tool 10 is placed over a chip which is to be removed from a socket in a circuit board, so that the chip nests closely within the lower cavity 32 of the skirt 30. The supports 72 rest on an upper surface of the chip to retain the tool 10 above the circuit board so that the tool 10 does not contact the circuit board. The size and shape of the skirt 30 and the alignment of the teeth 18, 20 on the arms 14, 16 are interrelated and are carefully predetermined so that when the chip is nested closely within the lower cavity 32 of the skirt 30, the teeth 18, 20 will be simultaneously aligned horizontally to pass between the pins extending downwardly from lower surfaces of the chips, without damaging the pins. The teeth 18, 20 are then vertically aligned to pass between the chip and the socket.

After the teeth 18, 20 are aligned, the handle 62 is twisted clockwise to advance the handle 62 further into the cavity 22. The lower end of the handle 62 forces the yoke 56 downwardly within the cavity 22 so that the lower surfaces of the legs 58, 60 simultaneously move the engaging members 52, 54 inwardly, thereby simultaneously moving the pistons 38, 40, arms 14, 16, and teeth 18, 20 inwardly. As the teeth 18, 20 move inwardly into the lower cavity 32, the planar, substantially horizontal lower surfaces 88 of the teeth 18, 20 rest upon and slide across the socket, and the angled upper surfaces 90, 92 of the teeth 18, 20 contact and slide across opposing edges of the lower surface of the chip. Advancing the teeth 18, 20 between the chip and socket forces the opposing edges of the lower surface of the chip to ride upwardly along the upwardly sloping upper surfaces 90, 92 of the teeth 18, 20 and to therefore move away from the underlying socket. In this manner, the teeth 18, 20 are driven inwardly into the lower cavity 32 and between the chip and socket until the chip is disengaged from the socket.

Within the lower cavity 32, the springs 82 permit the supports 72 to bias the chip against the teeth 18, 20 and to retract into the recesses 80 as the chip is moved upwardly within the lower cavity 32 by the teeth 18, 20. After the chip is disengaged from the socket, the tool 10 is removed with the supports 72 biasing the chip against the teeth 18, 20. The handle 62 is then twisted counterclockwise to retract the handle 62 from the cavity 22 until the teeth 18, 20 move outwardly from the lower cavity 32 to the open position so that the chip may be retrieved from the tool 10.

The symmetry of the tool 10 permits the teeth 18 of the arm 14 to be advanced into the lower cavity 32 and between the chip and socket at a velocity substantially equal and opposite to the velocity at which the teeth 20 of the arm 16 are advanced. Accordingly, the chip remains level as it is raised substantially vertically from the socket, thereby maintaining the pins substantially perpendicular to the socket and avoiding unnecessary transverse or horizontal forces on the pins as the chip is disengaged from the socket.

Further, the pistons 38, 40 and the guides 36 limit non-linear movement of the arms 14, 16 as the arms 14, 16 move toward or away from the base 12 so that the force applied by the teeth 18, 20 to opposing sides of the chip and socket is substantially evenly distributed along the sides of the chip and socket. Applying substantially even force along the opposing sides of the chip and socket as the chip is disengaged from the socket reduces the risk of damaging the chip or socket and avoids unnecessary and potentially damaging transverse, horizontal, or twisting forces on the pins.

It is understood that the present invention can take many forms and embodiments. The embodiments shown herein are intended to illustrate rather than to limit the invention, it being appreciated that variations may be made without departing from the spirit or scope of the invention. For example, it is anticipated that the tool 10 may be utilized without the skirt 30 and/or the supports 72, in which case the user aligns the teeth 18, 20 to pass between the chip and socket and between the pins without these aids. Also, the threaded handle 62 may be replaced by other means for controlling movement of the yoke 56 within the cavity 22. Further, the wedge-shaped teeth 18, 20 may be replaced by teeth which are not wedge-shaped so that the tool 10 must be lifted to disengage the chip from the socket after the teeth 18, 20 are driven between the chip and socket.

Although illustrative embodiments of the invention have been shown and described, a wide range of modification, change and substitution is intended in the foregoing disclosure and in some instances some features of the present invention may be employed without a corresponding use of other features. Accordingly, it is appropriate that the appended claims be construed broadly and in a manner consistent with the scope of the invention.

What is claimed is:

1. Apparatus for removing an integrated circuit chip from a socket, comprising:

a base having first and second opposing sides and a cavity, said first and second sides have first and second apertures, respectively, passing through said first and second sides from outer surfaces of said first and second sides to said cavity;

first and second arms slidably attached to said first and second base sides, respectively;

a first and second plurality of teeth projecting from inner surfaces of said first and second arms, respectively, at lower portions of said first and second arms;

first and second pistons secured to said first and second arms, respectively, and slidably extending through said first and second apertures, respectively, into said cavity so that said first and second plurality of teeth simultaneously engage said chip and said socket and simultaneously drive between said chip and said socket, said first and second plurality of teeth being shaped to increase separation of said chip from said socket as said first and second plurality of teeth are driven further between said chip and said socket so that said first and second plurality of teeth force said chip away from said socket until said chip is disengaged from said socket; and means for moving said first and second pistons inwardly toward one another, thereby moving said first and second plurality of teeth inwardly toward said base.

2. The apparatus of claim 1 wherein said first and second pistons include first and second engaging members, respectively, affixed near inner ends of said first and second pistons; and said means for moving said first and second pistons inwardly comprises means for contacting said first and second engaging members and moving said engaging members inwardly toward one another.

3. The apparatus of claim 2 wherein said first and second pistons have first and second channels, respectively, said first and second channels passing through said first and second pistons across a substantially vertical diameter of said first and second pistons and extending therethrough for at least a portion of said first and second piston's lengths; and said first and second engaging members comprise rods secured to said first and second pistons, respectively, and extending substantially horizontally across said first and second channels near said inner ends of said first and second pistons.

4. The apparatus of claim 2 wherein said cavity has first and second inner walls through which pass said first and second pistons, respectively, and wherein said means for moving said first and second engaging members inwardly toward one another comprises:

a yoke movably disposed within said cavity and having first and second legs aligned so that at least a portion of said first leg passes between said first engaging member and said first inner wall and at least a portion of said second leg passes between said second engaging member and said second inner wall; and means for moving said yoke within said cavity so that said first and second legs contact said first and second engaging members, respectively, and move said first and second engaging members inwardly toward one another.

5. The apparatus of claim 4 wherein said yoke is disposed substantially above said inner ends of said first and second pistons, and said first and second legs have first and second lower surfaces, respectively, which contact said first and second engaging members, said first and second lower surfaces being sloped so that said first and second lower surfaces move said first and second engaging members inwardly toward one another as said yoke is moved downwardly within said cavity.

6. The apparatus of claim 5 further comprising:

at least one spring disposed between said first arm and said first side of said base for biasing said first arm away from said base, thereby biasing said first engaging member against said first leg of said yoke; and at least one spring disposed between said second arm and said second side of said base for biasing said second arm away from said base, thereby biasing said second engaging member against said second leg of said yoke.

7. The apparatus of claim 5 wherein said first and second lower surfaces each slope downwardly from a central portion of said yoke at substantially equal and constant angles so that downward movement of said yoke causes said first and second engaging members to move simultaneously and at substantially equal and opposite velocities inwardly toward one another.

8. The apparatus of claim 1 wherein said base further comprises a skirt forming a lower portion of said base and having a second cavity sized to nestingly receive said chip.

9. The apparatus of claim 8 wherein said first and second plurality of teeth are disposed so that when said skirt is nested over said chip and when said first and second plurality of teeth engage said chip and said socket, said first and second plurality of teeth are aligned to pass between a plurality of pins extending from a lower surface of said chip.

10. The apparatus of claim 8 further comprising contact means retractably disposed within said second cavity for contacting said chip and supporting said apparatus from said chip.

11. The apparatus of claim 10 wherein said socket is disposed in a printed circuit board and said contact means are positioned within said second cavity to support said apparatus from said chip above said printed circuit board.

12. The apparatus of claim 10 wherein said contact means biases said chip against said first and second plurality of teeth as said first and second plurality of teeth force said chip away from said socket.

13. The apparatus of claim 10 wherein said second cavity has a roof and wherein said contact means comprises:

a planar support having upper and lower surfaces;

a plurality of rods secured to upper surfaces of said support and extending upwardly through said second cavity and extending slidably through holes formed in said roof of said second cavity;

at least one spring disposed between said roof of said second cavity and said upper surface of said support for urging said support away from said roof of said second cavity.

14. Apparatus for removing an integrated circuit chip from a socket, comprising:

a base having first and second opposing sides, respectively, a cavity, and first and second apertures passing through said first and second sides, respectively, from outer surfaces of said first and second sides through first and second inner walls of said first and second opposing sides, respectively, to said cavity;

first and second arms slidably attached to said first and second base sides, respectively;

a first and second plurality of teeth projecting from inner surfaces of said first and second arms, respectively, at lower portions of said first and second arms;

first and second pistons secured to said first and second arms, respectively, and slidably extending through said first and second apertures, respectively, into said cavity;

said first and second pistons include first and second engaging members, respectively, affixed near inner ends of said first and second pistons;

a yoke movably disposed within said cavity and having first and second legs aligned so that at least a portion of said first leg passes between said first engaging member and said first inner wall and at least a portion of said second leg passes between said second engaging member and said second inner wall; and means for moving said yoke within said cavity so that said first and second legs contact said first and second engaging members, respectively, and move said first and second engaging members inwardly toward one another to move said first and second pistons inwardly toward one another, thereby moving said first and second plurality of teeth inwardly toward said base.

15. The apparatus of claim 14 wherein said base further comprises a skirt forming a lower portion of said base and having a second cavity sized to nestingly receive said chip.

16. The apparatus of claim 15 wherein said first and second plurality of teeth are disposed so that when said skirt is nested over said chip and when said first and second plurality of teeth engage said chip and said socket, said first and second plurality of teeth are aligned to pass between a plurality of pins extending from a lower surface of said chip.

* * * * *